(12) United States Patent
Zhao et al.

(10) Patent No.: US 12,379,798 B2
(45) Date of Patent: Aug. 5, 2025

(54) DISPLAY ASSEMBLY, DISPLAY APPARATUS, AND DRIVING METHOD

(71) Applicant: HUAWEI TECHNOLOGIES CO., LTD., Guangdong (CN)

(72) Inventors: Yang Zhao, Shenzhen (CN); Xinkai Wu, Shanghai (CN); Chun Yen Liu, Dongguan (CN); Xiaojun Guo, Shanghai (CN); Haiming He, Shenzhen (CN); Xiao Hou, Shanghai (CN); Xiaokuan Yin, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 495 days.

(21) Appl. No.: 17/915,920

(22) PCT Filed: Mar. 18, 2021

(86) PCT No.: PCT/CN2021/081399
§ 371 (c)(1),
(2) Date: Sep. 29, 2022

(87) PCT Pub. No.: WO2021/197079
PCT Pub. Date: Oct. 7, 2021

(65) Prior Publication Data
US 2023/0147182 A1 May 11, 2023

(30) Foreign Application Priority Data
Mar. 31, 2020 (CN) .......................... 202010246056.0

(51) Int. Cl.
*G06F 3/041* (2006.01)
*G06V 40/13* (2022.01)
(Continued)

(52) U.S. Cl.
CPC .......... *G06F 3/0412* (2013.01); *G06F 3/0416* (2013.01); *G06V 40/1318* (2022.01);
(Continued)

(58) Field of Classification Search
CPC ................. G06F 3/0412; G06F 3/0416; G06F 2203/04103; G06F 2203/04106;
(Continued)

(56) References Cited

U.S. PATENT DOCUMENTS 10,311,277 B2 * 6/2019 Liu et al. ............... H10K 59/40
11,502,133 B2 * 11/2022 Wang et al. .......... G06F 3/0443
(Continued)

FOREIGN PATENT DOCUMENTS

CN 106055162 A 10/2016
CN 107122759 A 9/2017
(Continued)

OTHER PUBLICATIONS

Translation for JP2019165129A (Year: 2019).*
(Continued)

*Primary Examiner* — Fazli Erdem
*Assistant Examiner* — Nathalie R Fayette
(74) *Attorney, Agent, or Firm* — Fish & Richardson P.C.

(57) ABSTRACT

The present disclosure relates to display assemblies, display apparatus, and driving methods. One example display assembly includes a display panel and a function module located on a light-emitting surface of the display panel. A function unit in the function module includes at least one phototransistor and one switch transistor. The phototransistor includes a first active layer, a first gate, a first source, and a first drain. A material for making the first active layer includes an organic semiconductor material. The first active layer is located on a side of the first gate away from the display panel. The first drain and the first gate partially (Continued)

overlap to form a first capacitor. The switch transistor includes a second active layer, a second gate, a second source, and a second drain. The function unit includes a transparent electrode located on the first active layer and overlapping the first active layer.

20 Claims, 10 Drawing Sheets

(51) Int. Cl.
　　*G09G 3/3225*　　(2016.01)
　　*H10K 39/34*　　(2023.01)
　　*H10K 59/40*　　(2023.01)
　　*H10K 59/65*　　(2023.01)
　　*H10K 59/80*　　(2023.01)

(52) U.S. Cl.
　　CPC .......... *G09G 3/3225* (2013.01); *H10K 39/34* (2023.02); *H10K 59/40* (2023.02); *G09G 2380/08* (2013.01); *H10K 59/65* (2023.02); *H10K 59/873* (2023.02)

(58) Field of Classification Search
　　CPC . G06F 3/0421; G06F 3/0443; G06V 40/1318; G09G 3/3225; G09G 2380/08; H10K 39/34; H10K 59/40; H10K 59/65; H10K 59/873; H10K 59/122; H10K 59/123; H10K 59/131; G02F 1/13338
　　See application file for complete search history.

(56) References Cited

U.S. PATENT DOCUMENTS

| | | | |
|---|---|---|---|
| 2004/0252867 A1* | 12/2004 | Lan et al. | G06V 40/1318 382/124 |
| 2018/0053032 A1* | 2/2018 | Ding et al. | G06V 40/1318 |
| 2018/0129043 A1* | 5/2018 | Kim et al. | H10F 77/244 |
| 2018/0150670 A1* | 5/2018 | Jang et al. | H10K 59/60 |

FOREIGN PATENT DOCUMENTS

| | | | | |
|---|---|---|---|---|
| CN | 107342308 A | | 11/2017 | |
| CN | 107479763 A | | 12/2017 | |
| CN | 107579101 A | | 1/2018 | |
| CN | 109800623 A | | 5/2019 | |
| CN | 109962114 A | | 7/2019 | |
| CN | 110211975 A | | 9/2019 | |
| CN | 110214378 A | | 9/2019 | |
| CN | 110286796 A | | 9/2019 | |
| JP | 2019165129 A | * | 9/2019 | ............... G09F 9/30 |

OTHER PUBLICATIONS

Extended European Search Report in European Appln No. 21780267.7, dated Jul. 31, 2023, 5 pages.

International Search Report and Written Opinion in International Appln. No. PCT/CN2021/081399, mailed on Jul. 1, 2021, 13 pages (with English translation).

* cited by examiner

DISPLAY ASSEMBLY, DISPLAY APPARATUS, AND DRIVING METHOD

CROSS-REFERENCE TO RELATED APPLICATIONS

This application is a national stage of International Application No. PCT/CN2021/081399, filed on Mar. 18, 2021, which claims priority to Chinese Patent Application No. 202010246056.0, filed on Mar. 31, 2020. Both of the aforementioned applications are hereby incorporated by reference in their entireties.

TECHNICAL FIELD

This application relates to the field of display technologies, and more specifically, to a display assembly, a display apparatus, and a driving method.

BACKGROUND

With development of electronic technologies, portable electronic devices such as a smartphone and a tablet computer have become necessary tools in people's life. Since a concept of a bezel-less screen has been put forward, the bezel-less screen has become a research focus of major vendors. A physical button on a front side of an electronic device is removed, a touch control function is used to control display of the electronic device, and a frame is gradually reduced, so as to increase a display screen-to-body ratio and improve visual experience.

With development of fingerprint recognition technologies, fingerprint detection is also applied to the electronic device for identity authentication and permission management. Currently, a mainstream fingerprint recognition technology is in-screen optical fingerprint recognition. An optical fingerprint recognition module is disposed on a back side of a substrate of a display panel, and light emitted by a fingerprint recognition light source irradiates to a finger. After being reflected by the finger, the light penetrates through the display panel, and then is received by a photosensitive element, to convert an optical signal into an electrical signal. This implements fingerprint recognition. In a solution in the conventional technology, after light used for fingerprint recognition penetrates through the entire display panel in a thickness direction of the display panel, light loss is large. This seriously affects an amount of light received by the photosensitive element, and further affects accuracy of fingerprint recognition. In addition, in a display assembly that has both a touch control function and a fingerprint recognition function, the touch control function and the fingerprint recognition function are usually implemented through independent module structures. Consequently, a structure of the display assembly is complex, and complexity of a making process is increased.

Therefore, it is an urgent technical problem to be resolved about how to improve accuracy of fingerprint recognition detection, and simplify process complexity of the display assembly integrating the touch control function and the fingerprint recognition function at present.

SUMMARY

In view of this, this application provides a display assembly, a display apparatus, and a driving method. A function unit including a switch transistor and a phototransistor is used to implement both a touch control function and a fingerprint recognition function, and the function unit is disposed on a light-emitting surface of a display panel. This improves accuracy of fingerprint recognition detection, and simplifies process complexity of the display assembly.

According to a first aspect, an embodiment of this application provides a display assembly, including a display panel and a function module located on a light-emitting surface of the display panel. The function module includes a plurality of function units, and each function unit includes at least one phototransistor and one switch transistor. The phototransistor includes a first active layer, a first gate, a first source, and a first drain, and a material for making the first active layer includes an organic semiconductor material. The first active layer is located on a side that is of the first gate and that is away from the display panel, and the first drain and the first gate partially overlap to form a first capacitor in a direction perpendicular to the display assembly. The switch transistor includes a second active layer, a second gate, a second source, and a second drain, where the second source is connected to the first drain. Each function unit includes a transparent electrode, and the transparent electrode is located on a side that is of the first active layer and that is away from the first gate. The transparent electrode overlaps the first active layer in the direction perpendicular to the display assembly, and a dielectric layer is disposed between the transparent electrode and the first active layer.

The disposed function module includes a plurality of function units each including a switch transistor, a phototransistor, and a transparent electrode, and can implement both fingerprint recognition and touch control functions. The fingerprint recognition and touch control functions are integrated into one function module, so that modules disposed in the display assembly can be reduced. This helps reduce an overall thickness of the display assembly. In addition, the function module is disposed on the light-emitting surface of the display panel. During fingerprint recognition, light reflected by a finger can be received by the function module without penetrating through a structural film layer of the display panel. This shortens a transmission distance of fingerprint reflected light, and can improve collimation of the fingerprint reflected light, avoid a light loss caused when the fingerprint reflected light penetrates through the structural film layer of the display panel, and improve fingerprint recognition accuracy. Lighting of a fingerprint recognition light source can be controlled through a touch position detection function. This avoids damage to the display assembly caused by lighting of the light source in a pressing manner. In addition, a structure of the phototransistor is similar to that of the switch transistor. During making, the phototransistor and the switch transistor can share at least a part of a making process. This can reduce structure and process complexity of the display assembly, and can also help reduce an overall thickness of the display assembly.

Specifically, a thickness of the dielectric layer is d1, and 500 nm≤d1≤1000 nm. In this way, touch control detection sensitivity can be ensured when a requirement of a process for making the dielectric layer is met.

Specifically, the display assembly further includes a planarization layer and a protective cover. The planarization layer is located on a side that is of the function module and that is away from the display panel, and the protective cover is located on a side that is of the planarization layer and that is away from the function module. A sum of a thickness of the planarization layer on the top of the transparent electrode and a thickness of the protective cover is d2, and 300 nm≤d2≤1.5 μm. A value of d2 is set to meet a specific range, so that the display assembly can be well protected, and it is ensured that a distance between the transparent electrode and an outer surface of the display assembly is small. During touch position detection, when the finger touches a position corresponding to the transparent electrode, a small amount of charge carried on the finger is effectively transferred to the transparent electrode. This ensures touch control detection sensitivity.

A material for making the dielectric layer includes any one or more of silicon oxide, aluminum oxide, hafnium oxide, silicon nitride, ES2110, poly(vinyl cinnamate) (PVCN), polyvinyl alcohol, and polymethyl methacrylate. The material for making the dielectric layer may be selected according to a specific design requirement. A dielectric constant of the material for making the dielectric layer and a thickness of the dielectric layer cooperate with the first active layer and the transparent electrode to form a capacitor, to ensure implementation of the touch position detection function.

In an embodiment, the function module includes a first metal layer, and the first source, the first drain, the second source, and the second drain are all located at the first metal layer. The source and the drain of the phototransistor and the source and the drain of the switch transistor are made in a same etching process, so that process complexity can be reduced.

In an embodiment, the function module further includes a second metal layer and a first insulation layer. The second metal layer is located on a side that is of the first metal layer and that is close to the display panel. The first insulation layer is located between the first metal layer and the second metal layer. The first gate is located at the second metal layer.

In an embodiment, both the first active layer and the second active layer are located on a side that is of the first insulation layer and that is away from the second metal layer, and are in contact with the first insulation layer. The first active layer and the second active layer are equivalently located at a height of a same film layer. This can help reduce a thickness of a film layer of the function module, and further help reduce an overall thickness of the display assembly.

In an embodiment, the first source is connected to the first gate through a via in the first insulation layer.

Optionally, the second gate is located at the second metal layer. Both the switch transistor and the phototransistor are of a bottom gate structure. The switch transistor and the phototransistor have a same structure, and can be made in a same process. This further reduces structure and process complexity of the display assembly.

Optionally, the second active layer and the first active layer are made of a same material at a same layer. This can further simplify the making process and reduce the complexity of the process.

In an embodiment, the function unit further includes a light shielding part. The light shielding part is located on a side that is of the second active layer and that is away from the display panel. An orthographic projection of the light shielding part on a plane on which the second active layer is located covers the second active layer. The light shielding part can shield light, to prevent the light from irradiating to a surface of the second active layer, so that a carrier inside the second active layer increases. This avoids impact on an on/off status of the switch transistor, and ensures accuracy and performance reliability of fingerprint recognition detection.

In an embodiment, the second gate is located on a side that is of the second active layer and that is away from the display panel, and the dielectric layer is spaced between the second gate and the second active layer. The second gate can be reused as a light shielding part, and the second gate can shield light, to prevent fingerprint reflected light from irradiating to a surface of the second active layer.

Specifically, the display panel includes a plurality of pixel areas and a non-pixel area located between the adjacent pixel areas. An orthographic projection of the function unit on the display panel is located in the non-pixel area. When the display assembly displays, the function unit does not shield light emission of the pixel area, so as to ensure that disposition of the function module does not affect a display effect.

According to a second aspect, based on a same inventive concept, an embodiment of this application further provides a display apparatus, including the display assembly provided in any embodiment of this application.

According to a third aspect, based on a same inventive concept, an embodiment of this application further provides a display apparatus, including a driving method for a display assembly provided in any embodiment of this application, and the driving method is applicable to the display assembly provided in any embodiment of this application. The driving method includes: controlling both the switch transistor and the phototransistor to be turned off, and charging the first capacitor to accumulate an amount of initial charge under an action of a leakage current of the phototransistor; controlling the switch transistor to be turned on, discharging the first capacitor, and controlling the switch transistor to be turned off after reading the amount of initial charge through the second drain; in response to a touch of a finger, changing an electric field between the transparent electrode and the first active layer, and charging the first capacitor to accumulate an amount of touch charge; and controlling the switch transistor to be turned on, discharging the first capacitor, reading the amount of touch charge through the second drain, and determining a touch position of the finger based on the amount of touch charge.

Further, the driving method further includes: determining, based on the touch position, a fingerprint recognition light source corresponding to the touch position, and controlling the fingerprint recognition light source to be turned on; after the phototransistor receives light reflected by the finger, increasing the leakage current, and charging the first capacitor to accumulate an amount of fingerprint charge; and controlling the switch transistor to be turned on, discharging the first capacitor, and reading the amount of fingerprint charge through the second drain.

The display assembly, the display apparatus, and the driving method provided in this application have the following beneficial effects:

The plurality of function units each including a switch transistor, a phototransistor, and a transparent electrode can implement both fingerprint recognition and touch control functions. The fingerprint recognition and touch control functions are integrated into one function module, so that modules disposed in the display assembly can be reduced. This helps reduce an overall thickness of the display assembly. In addition, the function module is disposed on the light-emitting surface of the display panel. This shortens a transmission distance of fingerprint reflected light, and can improve collimation of the fingerprint reflected light, and improve fingerprint recognition accuracy. In this application, lighting of a fingerprint recognition light source can be controlled through a touch detection function. This avoids damage to the display assembly caused by lighting of the light source in a pressing manner. In addition, a structure of the phototransistor is similar to that of the switch transistor. During making, the phototransistor and the switch transistor can share at least a part of a making process. This can reduce structure and process complexity of the display assembly, and can also help reduce an overall thickness of the display assembly. In addition, the phototransistor can have a good light sensing effect even when a size of the phototransistor is small. The phototransistor does not shield the light emitted from the display panel as it is disposed on the light-emitting surface of the display panel.

DESCRIPTION OF EMBODIMENTS

In a related technology, a solution is provided. A switch transistor and a photodiode are integrated into a module that can implement fingerprint recognition and touch control functions, and the module is disposed on an encapsulation film of a display panel. In a fingerprint recognition process, a transmission distance of fingerprint reflected light can be shortened, and fingerprint detection accuracy can be improved. However, the switch transistor and the photodiode have a large difference in structure and making process. Therefore, the switch transistor and the photodiode need to be separately made. Consequently, complexity of a marking process of a display assembly is increased, and an overall thickness of a module including the switch transistor and the photodiode is large.

In a related technology, a method for implementing fingerprint recognition is provided. A pressure detection unit is integrated into a light emitting layer of a display panel, and a photosensitive element is integrated into an encapsulation layer of the display panel. In a dark state, a screen is pressed to enable a pixel unit of the display panel to emit light, and the pixel unit is used as a light source. After the light source irradiates to a finger, a light beam is diffusely reflected by the finger, and a difference of light energy during diffuse reflection on a valley and a peak of a fingerprint is detected, to implement fingerprint recognition. In other words, a pixel unit on the display panel is pressed by the finger to emit light, and then a fingerprint recognition function is implemented through the photosensitive element. In this technology, a plurality of pressure detection units are integrated on the light emitting layer of the display panel, so that a thickness of the display assembly is increased. In addition, the pixel unit is lighted up in a finger pressing manner. This increases a loss of the panel caused by pressing on the panel.

Based on this, embodiments of this application provide a display assembly. A function module integrating a phototransistor and a switch transistor is disposed on a light-emitting surface of a display panel, to implement both a fingerprint recognition function and a touch control function, improve fingerprint recognition accuracy, reduce structure and process complexity of the display assembly, and avoid a loss caused to the display assembly by lighting a light source in a pressing manner.

Figure 1:
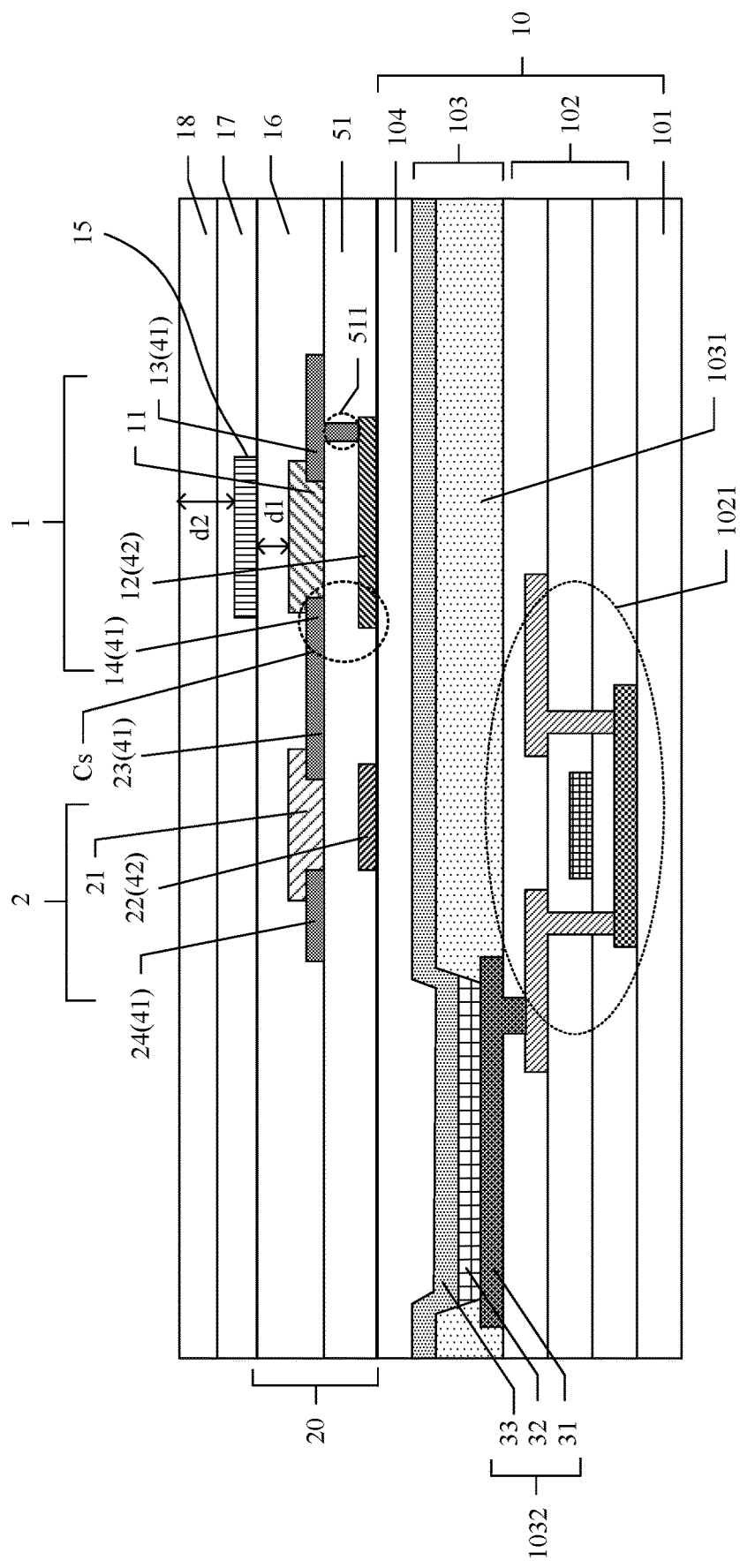
FIG. 1 is a schematic diagram of a partial structure of film layers of a display assembly according to an embodiment of this application.
Figure 2:
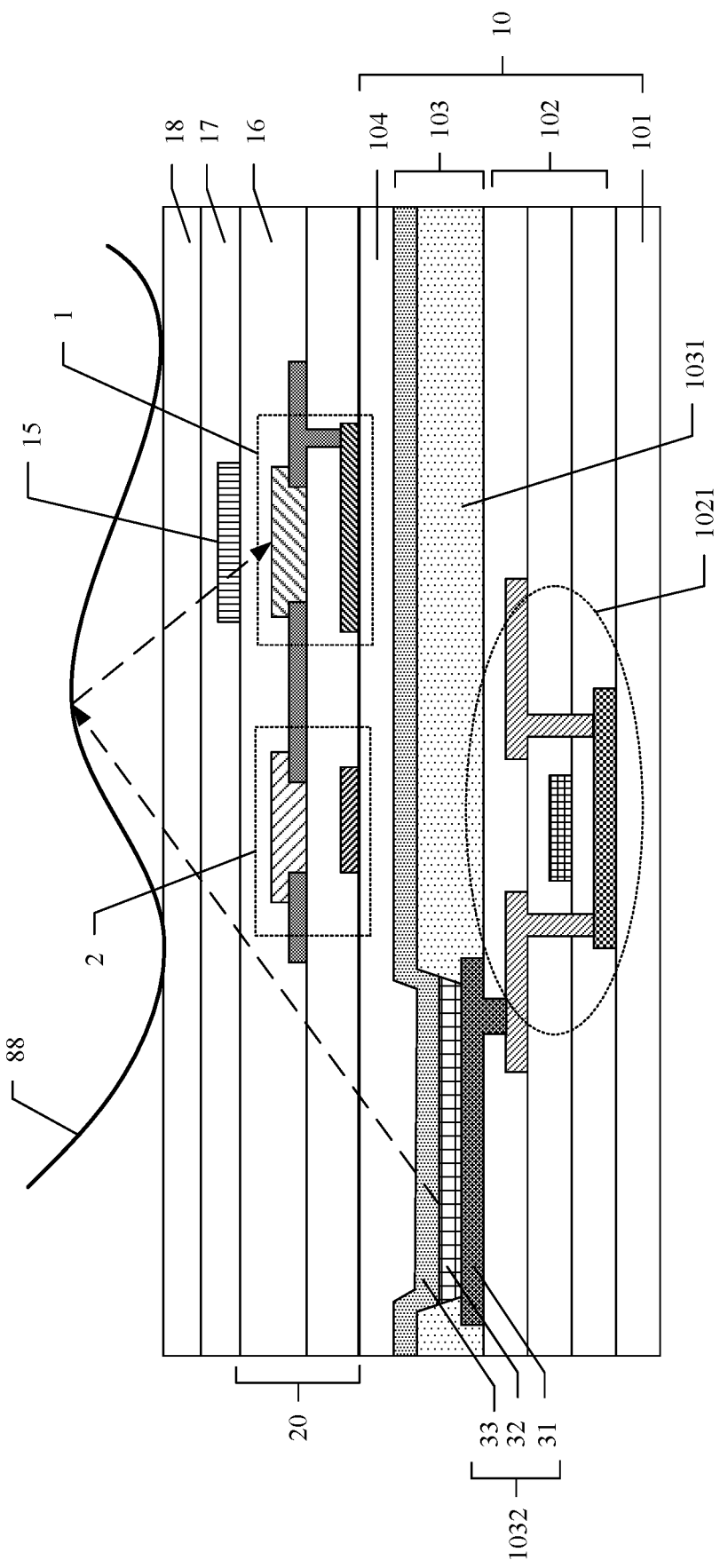
FIG. 2 is a schematic diagram of an optical path of light used for fingerprint detection by the display assembly in a fingerprint recognition phase according to the embodiment in FIG. 1.

FIG. 1 is a schematic diagram of a partial structure of film layers of a display assembly according to an embodiment of this application. FIG. 2 is a schematic diagram of an optical path of light used for fingerprint detection by the display assembly in a fingerprint recognition phase according to the embodiment in FIG. 1.

As shown in FIG. 1, the display assembly includes a display panel 10 and a function module 20 located on a light-emitting surface of the display panel 10. The light-emitting surface of the display panel 10 is a surface of a side on which the display panel displays a picture. The display panel 10 is any one of an organic light emitting display panel, a liquid crystal display panel, or a microdiode display panel. FIG. 1 shows only an example in which the display panel is an organic light emitting display panel. The display panel 10 includes a substrate 101, an array substrate 102, a display layer 103, and an encapsulation structure 104. In this case, the light-emitting surface of the display panel 10 is an outer surface of a side that is of the encapsulation structure 104 and that is away from the display layer 103. The substrate 101 may be a flexible substrate or a rigid substrate. The array substrate 102 includes a plurality of pixel circuits, and only a drive transistor 1021 in the pixel circuit is shown in the figure. The display layer 103 includes a pixel definition layer 1031 and a plurality of light emitting components 1032. Only one light emitting component 1032 is shown in the figure. The light emitting component 1032 includes an anode 31, a light emitting layer 32, and a cathode 33 that are stacked in sequence. The anode 31 is electrically connected to the drive transistor 1021 through a via. The encapsulation structure 104 is configured to encapsulate the display layer 103 to isolate water and oxygen, so as to ensure a service life of the light emitting component 1032. The encapsulation structure 104 may be rigid encapsulation, and includes an encapsulation cover and a sealant. Alternatively, the encapsulation structure 104 may be thin film encapsulation, and includes at least one organic encapsulation layer and at least one inorganic encapsulation layer that are alternately stacked.

The function module 20 includes a plurality of function units, and each function unit includes at least one phototransistor 1 and one switch transistor 2 connected to the phototransistor 1. Only one function unit is shown in the figure.

The phototransistor 1 includes a first active layer 11, a first gate 12, a first source 13, and a first drain 14. A material for making the first active layer 11 includes an organic semiconductor material. The first active layer 11 is located on a side that is of the first gate 12 and that is away from the display panel 10. In a direction perpendicular to the display assembly, the first drain 14 and the first gate 12 partially overlap to form a first capacitor Cs. The organic semiconductor material is any one or more of pentacene (pentacene), 6,13-bis(triisopropylsilanesylacetylene)-pentene (TIPS-pentacene), copper phthalocyanine (CuPc), (dinaphtho[2,3-b:2', 3'-f]thieno[3,2-b]thiophene) (DNTT), 2,6-bis(methoxyphenyl)anthracene(BOPAnt), poly-3-hexylthiophene(P3HT), poly[bis(3-dodecyl-2-thienyl)-2,2'-dithiophene-5,5'-diyl] (poly[bis(3-dodecyl-2-thienyl)-2,2'-dithiophene-5,5'-diyl], PQT-12), PDVT-10(poly[2,5-bis(alkyl) pyrrolo[3,4-c]-1,4 (2H,5H)-dione-alt-5,5'-di(thiophene-2-yl)-2,2'-(E)-2-(2-(thiophen-2-yl)vinyl) thio-phene]), and diketopyrrolo-pyrrole dithienylthieno[3,2-b]thiophene (DPP-DTT). When the first active layer 11 is being manufactured, a film may be coated by using a solution method, and then a pattern of the first active layer 11 is formed by using an etching process. The first active layer 11 may alternatively be formed by forming a film by using a deposition method. The organic semiconductor material strongly absorbs light. The first active layer 11 is used as a light sensing layer. When light irradiates to a surface of the first active layer 11, an electron-hole pair is correspondingly generated inside the first active layer 11 each time a photon is absorbed. Due to an action of an electric field, electrons and holes are separated to generate charge carriers, and the charge carriers migrate inside the material to form a current. This implements converting an optical signal into an electrical signal. Different organic semiconductor materials have different light-sensitive bands. To implement a fingerprint recognition function, a light-sensitive band of an organic semiconductor material may actually cooperate with a fingerprint recognition light source. The first active layer uses an organic semiconductor material that is sensitive to visible light, for example, an organic semiconductor material that is sensitive to green light, to cooperate with a fingerprint recognition light source that can emit green light. Alternatively, the first active layer uses an organic semiconductor material that is sensitive to infrared light, to cooperate with a fingerprint recognition light source that can emit infrared light.

A working state of the phototransistor 1 includes a dark state and an illumination state. The dark state of the phototransistor 1 is a state when no light irradiates to the surface of the first active layer 11. In the dark state, when a bias voltage is applied to the phototransistor 1, there is a small leakage current in the first active layer 11. Correspondingly, the illumination state of the phototransistor 1 is a state when light irradiates to the surface of the first active layer 11. In the illumination state, there is a small leakage current and a photocurrent generated by light excitation in the first active layer 11.

The switch transistor 2 includes a second active layer 21, a second gate 22, a second source 23, and a second drain 24. The second source 23 is connected to the first drain 14, and a material for making the second active layer 21 may be a silicon semiconductor material, such as a monocrystalline silicon semiconductor or a polycrystalline silicon semiconductor, or may be an organic semiconductor material. The material for making the second active layer 21 includes any one or more of pentacene, TIPS-pentacene, CuPc, DNTT, BOPAnt, P3HT, PQT-12, PDVT-10, DPP-DTT, 2,7-diocty[1]benzothieno[3,2-B]benzothiophene (C8-BTBT), [4,4,9, 9-tetra(4-hexylphenyl)-s-benzodipyridine[1,2-b:5,6-b']di-thiophene]-benzothiodiazole copolymer (C16-IDTBT), 2,8-difluoro-5,11-bis(triethylsilylethynyl)anthradithiophene (diF-TES-ADT), and 2,9-diphenyl-dinaphtho[2,3-b:2',3'-f] thieno[3,2-b]thiophene (Dph-DNTT). The second active layer 21 and the first active layer 11 may be made of a same material, or the second active layer 21 and the first active layer 11 may be made of different materials.

Each function unit includes a transparent electrode 15. The transparent electrode 15 is located on a side that is of the first active layer 11 and that is away from the first gate 12. In a direction perpendicular to the display assembly, the transparent electrode 15 overlaps the first active layer 11, and a dielectric layer 16 is disposed between the transparent electrode 15 and the first active layer 11. The transparent electrode 15 has a high transmittance of light, and may be made of a metal oxide material, for example, an indium tin oxide. If the transparent electrode 15 overlaps the first active layer 11, a capacitor is formed between the transparent electrode 15 and the first active layer 11. When a finger touches a position corresponding to the transparent electrode 15 of the display assembly, an electric field between the transparent electrode 15 and the first active layer 11 changes. The change of the electric field may be caused by a change of a capacitance value, or may be caused by a capacitive coupling effect caused by charge carried on the finger. When a small amount of charge carried on the finger penetrates through a thin film layer between the finger and the transparent electrode 15 and is transferred to the transparent electrode 15, an electric field between the transparent electrode 15 and the first active layer 11 changes. Alternatively, when the finger touches a position corresponding to the transparent electrode 15 of the display assembly, the dielectric layer 16 between the transparent electrode 15 and the first active layer 11 deforms due to slight pressing of the finger. This causes a capacitance change between the transparent electrode 15 and the first active layer 11.

The display assembly provided in this embodiment of this application can implement both a touch control function and a fingerprint recognition function. The following describes a driving method for implementing a touch control function and a fingerprint recognition function.

A working process of a function unit is used as an example. In a touch control phase, the driving method includes a startup phase, an initial signal reading phase, a touch signal accumulation phase, and a touch signal reading phase.

In the startup phase, when the switch transistor 2 and the phototransistor 1 are controlled to be turned off, the phototransistor 1 is in the dark state and there is a small leakage current in the phototransistor 1. In this way, the first capacitor Cs formed between the first drain 14 and the first gate 12 of the phototransistor 1 is charged to accumulate a small amount of initial charge, which is recorded as an amount of initial charge $Q_0$.

In the initial signal reading phase, when the switch transistor 2 is controlled to be turned on, the second source 23 and the second drain 24 of the switch transistor 2 are connected. Because the first drain 14 is connected to the second source 23, the first capacitor Cs discharges, the amount of initial charge $Q_0$ is read through the second drain 24, and then the switch transistor 2 is controlled to be turned off.

In the touch signal accumulation phase, in response to a touch of the finger, an electric field between the transparent electrode 15 and the first active layer 11 changes. This causes an increase in an amount of charge accumulated during charging of the first capacitor Cs, and the amount of charge is recorded as an amount of touch charge $Q_1$.

In the touch signal reading phase, the switch transistor 2 is controlled to be turned on, the first capacitor Cs discharges, the amount of touch charge $Q_1$ is read through the second drain 24, and a touch position of the finger is determined based on the amount of touch charge $Q_1$. Optionally, when the amount of touch charge $Q_1$ reaches a specific charge amount threshold, a touch operation of the finger is identified; or when it is detected that the amount of touch charge $Q_1$ is less than the charge amount threshold, no touch operation is identified. This ensures accuracy of the touch control operation, and avoids impact on user experience due to misjudgment of a touch.

After the touch operation of the finger is identified, the touch position of the finger is determined based on a coordinate position of the function unit disposed in a system mainboard. Then, the system mainboard controls, based on the touch position, the display assembly to perform a corresponding operation, for example, opening an application program or returning to a main interface, thereby implementing a touch control function.

A working process of a function unit is used as an example. In a fingerprint recognition phase, the driving method includes a startup phase, an initial signal reading phase, a touch signal accumulation phase, a touch signal reading phase, a fingerprint recognition light source invoking phase, a fingerprint signal accumulation phase, and a fingerprint signal reading phase. Refer to an example in FIG. 2. FIG. 2 shows only the example in which a light emitting component 1032 on the display panel 10 is reused as a fingerprint recognition light source. As shown in FIG. 2, in the fingerprint recognition phase, after being emitted from a light-emitting surface of the display panel 10, light emitted by the light emitting component 1032 irradiates to a finger 88 of a user after penetrating through the function module 20. Light reflected by the finger penetrates through the transparent electrode 15 and then irradiates to a first active layer of the phototransistor 1. The first active layer absorbs fingerprint reflected light and then converts an optical signal into an electrical signal.

In the startup phase, when the switch transistor 2 and the phototransistor 1 are controlled to be turned off, the phototransistor 1 is in the dark state and there is a small leakage current in the phototransistor 1. In this way, the first capacitor Cs formed between the first drain 14 and the first gate 12 of the phototransistor 1 is charged to accumulate a small amount of initial charge, which is recorded as an amount of initial charge $Q_0$.

In the initial signal reading phase, when the switch transistor 2 is controlled to be turned on, the second source 23 and the second drain 24 of the switch transistor 2 are connected. Because the first drain 14 is connected to the second source 23, the first capacitor Cs discharges, the amount of initial charge $Q_0$ is read through the second drain 24, and then the switch transistor 2 is controlled to be turned off.

In the touch signal accumulation phase, in response to a touch of the finger, an electric field between the transparent electrode 15 and the first active layer 11 changes. This causes an increase in an amount of charge accumulated during charging of the first capacitor Cs, and the amount of charge is recorded as an amount of touch charge $Q_1$.

In the touch signal reading phase, the switch transistor 2 is controlled to be turned on, the first capacitor Cs discharges, the amount of touch charge $Q_1$ is read through the second drain 24, and a touch position of the finger is determined based on the amount of touch charge $Q_1$. Optionally, when the amount of touch charge $Q_1$ reaches a specific charge amount threshold, a touch operation of the finger is identified; or when it is detected that the amount of touch charge $Q_1$ is less than the charge amount threshold, no touch operation is identified. After the touch operation of the finger is identified, the touch position of the finger is determined based on a coordinate position of the function unit disposed in a system mainboard.

In the fingerprint recognition light source invoking phase, a fingerprint recognition light source corresponding to the touch position is determined based on the touch position, and the fingerprint recognition light source is controlled to be turned on. A pixel unit of the display panel 10 may be reused as the fingerprint recognition light source, or the fingerprint recognition light source may be an external light source and disposed on a side that is of the display panel 10 and that is away from the function module 20. For example, the pixel unit of the display panel 10 is used as the fingerprint recognition light source. On an organic light emitting display panel, the pixel unit includes a light emitting component. After the touch position of the finger is determined, a plurality of light emitting components around the coordinate position are selected as the fingerprint recognition light source based on coordinates of the touch position. In this case, only the plurality of light emitting components at the touch position of the finger need to be lighted, and all the light emitting components in a display area do not need to be lighted. In addition, when function units are disposed in an entire-surface display area of the display assembly, entire-surface fingerprint recognition can be implemented by invoking the fingerprint recognition light source, and fingerprint recognition does not need to be limited to a fixed area.

After the fingerprint recognition light source is turned on, light emitted by the light source is reflected by the finger, then penetrates through the transparent electrode 15 and is emitted to the first active layer 11 of the phototransistor 1.

In the fingerprint signal accumulation phase, after the phototransistor 1 receives the light reflected by the finger, the phototransistor 1 is in an illumination state, and the first active layer 11 is irradiated by the light to generate a charge carrier therein. In this case, a current in the phototransistor 1 increases, and an amount of charge accumulated during charging of the first capacitor Cs increases, which is recorded as an amount of fingerprint charge $Q_2$. When the finger presses a surface of the display assembly, a fingerprint ridge of the finger is in direct contact with the surface of the display assembly, so that the light emitted by the fingerprint recognition light source is received by the phototransistor 1 after being reflected on an interface on which the fingerprint ridge is in contact with the display assembly. There is air between a fingerprint valley and the surface of the display assembly, so that the light emitted by the fingerprint recognition light source only can be received by the phototransistor 1 after penetrating through an interface between the display assembly and the air, being reflected by the fingerprint valley and then penetrating through the interface between the display assembly and the air again. Therefore, the light reflected by the ridge has light intensity larger than that of the light reflected by the valley. Correspondingly, in the fingerprint signal accumulation phase, a photocurrent generated when the phototransistor receives the light reflected by the ridge is larger than a photocurrent generated when the phototransistor receives the light reflected by the valley. In this case, more charge is accumulated on the first capacitor when the phototransistor receives the light reflected by the ridge. Therefore, in subsequent operation processing, the fingerprint valley and the fingerprint ridge may be distinguished based on a value of an amount of fingerprint charge.

In the fingerprint signal reading phase, when the switch transistor 2 is controlled to be turned on, the second source 23 and the second drain 24 of the switch transistor 2 are connected again, the first capacitor Cs discharges, and the amount of fingerprint charge $Q_2$ is read through the second drain 24.

The amount of initial charge $Q_0$ and the amount of fingerprint charge $Q_2$ are separately read through the second drain, and the amount of initial charge $Q_0$ and the amount of fingerprint charge $Q_2$ are transferred to a fingerprint data processing module (a module in a system mainboard). The fingerprint data processing module collects fingerprint detection signals returned by a plurality of fingerprint recognition units and performs operation processing, to finally generate fingerprint information and implement a fingerprint recognition function.

According to the display assembly provided in this embodiment of this application, the function module includes a plurality of function units each including a switch transistor, a phototransistor, and a transparent electrode, and can implement both fingerprint recognition and touch control functions. The fingerprint recognition and touch control functions are integrated into one function module, so that modules disposed in the display assembly can be reduced. This helps reduce an overall thickness of the display assembly. In addition, the function module is disposed on the light-emitting surface of the display panel. During fingerprint recognition, the light reflected by the finger can be received by the function module without penetrating through a structural film layer of the display panel. This shortens a transmission distance of fingerprint reflected light, and can improve collimation of the fingerprint reflected light, avoid a light loss caused when the fingerprint reflected light penetrates through the structural film layer of the display panel, and improve fingerprint recognition accuracy. Lighting of a fingerprint recognition light source can be controlled through a touch detection function. This avoids damage to the display assembly caused by lighting of the light source in a pressing manner. In addition, the phototransistor and the switch transistor are used in the function module to form the function unit. A structure of the phototransistor is similar to that of the switch transistor. During making, the phototransistor and the switch transistor can share at least a part of a making process. This can reduce structure and process complexity of the display assembly, and can also help reduce an overall thickness of the display assembly.

In addition, in this embodiment of this application, in the fingerprint recognition phase, the phototransistor in the function unit is used as a photosensitive element. In addition, a light sensing effect (that is, a photosensitive effect) of the photosensitive element is related to an order of magnitude that can be achieved by dividing a photocurrent by a dark current. That is, a larger difference between the photocurrent and the dark current indicates a better light sensing effect and higher sensitivity of fingerprint recognition. The dark current is a leakage current of the photosensitive element in the dark state (in a state in which no light irradiates), and the photocurrent is a current generated when the photosensitive element is excited by light in the illumination state (in a state in which light irradiates). In a fingerprint recognition solution in a related technology, a photodiode is used as a photosensitive element, and a leakage current of the photodiode in a dark state is at an nA level. In this case, a light sensing area of the photodiode usually needs to be large, to ensure a light sensing effect of the photodiode. Consequently, a fingerprint recognition module including a switch transistor and a photodiode occupies a large area. When the fingerprint recognition module is disposed on a display surface of a display panel, the fingerprint recognition module greatly shields light emitted from the display panel. This affects a display effect. However, in this embodiment of this application, the phototransistor and the switch transistor form the function unit. The leakage current of the phototransistor in the dark state is at a pA level. In other words, the leakage current of the phototransistor in the dark state is far less than the leakage current of the photodiode in the dark state. Therefore, the phototransistor in this application can have a good light sensing effect even when a size of the phototransistor is small. The phototransistor does not shield the light emitted from the display panel as it is disposed on the light-emitting surface of the display panel.

Still refer to FIG. 1. A thickness of the dielectric layer 16 between the transparent electrode 15 and the first active layer 11 is d1, and 500 nm≤d1≤1000 nm. When the finger touches the display assembly, touch detection needs to be implemented based on a capacitance change between the transparent electrode 15 and the first active layer 11 that overlap each other. According to a capacitance formula, when the thickness of the dielectric layer is large, a capacitance formed between the transparent electrode and the first active layer is small, and a small amount of charge carried on the finger has little impact on the capacitance or slight pressing of the finger has little impact on the capacitance. This affects touch control detection sensitivity. A process for making the dielectric layer varies with a material for making the dielectric layer, and a thickness of the dielectric layer that can be made by using a corresponding making process also varies. In this implementation, touch control detection sensitivity can be ensured when a requirement of the process for making the dielectric layer is met.

Optionally, the dielectric layer also has a planarization function. After the first active layer and the second active layer are made, the dielectric layer is made to form a flat surface, and the transparent electrode is made on the flat surface, so that distances from parts of the transparent electrode to an outer surface of the display assembly are approximately equal. The outer surface of the display assembly is also a surface touched by the finger of the user during use. During touch position detection, it can be ensured that when the finger touches a position corresponding to the transparent electrode, a small amount of charge carried on the finger is effectively transferred to the transparent electrode.

The material for making the dielectric layer may be an inorganic insulation material, or may be an organic insulation material. The material for making the dielectric layer includes any one or more of silicon oxide, aluminum oxide, hafnium oxide, silicon nitride, ES2110, poly(vinyl cinnamate) (poly(vinyl cinnamate), PVCN), polyvinyl alcohol (PVA), or polymethyl methacrylate (PMMA). The material for making the dielectric layer may be selected according to a specific design requirement. A dielectric constant of the material for making the dielectric layer and a thickness of the dielectric layer cooperate with the first active layer and the transparent electrode to form a capacitor, to ensure implementation of the touch position detection function.

Still refer to FIG. 1. The display assembly further includes a planarization layer 17 and a protective cover 18. The planarization layer 17 is located on a side that is of the function module 20 and that is away from the display panel 10, and the protective cover 18 is located on a side that is of the planarization layer 17 and that is away from the function module 20. The protective cover 18 may be a rigid cover, or may be a flexible cover. A sum of a thickness of the planarization layer 17 on the top of the transparent electrode 15 and a thickness of the protective cover 18 is d2, and 300 nm≤d2≤1.5 μm. The planarization layer on the transparent electrode ensures flatness of the outer surface of the display assembly, and the protective cover can protect the function module and ensure a service life of the display assembly. d2 is a distance between the transparent electrode and the outer surface of the display assembly. A value of d2 is set to meet a specific range, so that the display assembly can be well protected and it is ensured that the distance between the transparent electrode and the outer surface of the display assembly is small. During touch position detection, when the finger touches a position corresponding to the transparent electrode, a small amount of charge carried on the finger is effectively transferred to the transparent electrode. This ensures touch control detection sensitivity.

Optionally, in this embodiment of this application, no anti-impact layer is disposed on the planarization layer 17 and the protective cover 18, to reduce a distance between the transparent electrode 15 and the outer surface of the display assembly.

Still refer to FIG. 1. The function module 20 includes a first metal layer 41. The first source 13, the first drain 14, the second source 23, and the second drain 24 are all located at the first metal layer 41. In other words, in a making process of the display assembly, the first source 13, the first drain 14, the second source 23, and the second drain 24 may be made in a same etching process, so that complexity of the process may be reduced. Optionally, as shown in FIG. 1, the first drain 14 and the second source 23 are integrally formed to form a common electrode, one end of the common electrode is used as the first drain 14, and the other end of the common electrode is used as the second source 23.

Still refer to FIG. 1. The function module 20 further includes a second metal layer 42 and a first insulation layer 51. The second metal layer 42 is located on a side that is of the first metal layer 41 and that is close to the display panel 10. The first insulation layer 51 is located between the first metal layer 41 and the second metal layer 42. The first gate 12 is located at the second metal layer 42. That is, the first gate 12 of the phototransistor 1 is located on a side that is of the first active layer 11 and that is close to the display panel 10, the phototransistor 1 is a transistor of a bottom gate structure, and the first gate 12 does not shield light emitted to the first active layer 11. This ensures that the fingerprint reflected light can be emitted to the first active layer 11 in the fingerprint recognition phase, so that the phototransistor 1 converts an optical signal into an electrical signal.

In an embodiment, as shown in FIG. 1, the second gate 22 of the switch transistor 2 is also located at the second metal layer 42. The second gate 22 of the switch transistor 2 and the first gate 12 of the phototransistor 1 may be made of a same material at a same layer. In this embodiment, both the switch transistor and the phototransistor are of a bottom gate structure, and the switch transistor and the phototransistor have a same structure, so that the switch transistor and the phototransistor can be made in a same process. This further reduces structure and process complexity of the display assembly.

Still refer to FIG. 1. Both the first active layer 11 and the second active layer 21 are located on a side that is of the first insulation layer 51 and that is away from the second metal layer 42, and are in contact with the first insulation layer 51. In the making process, after a patterning process of the first gate 12 is completed, the first insulation layer 51 is made on the first gate 12, and then the first metal layer 41 is made on the first insulation layer 51. The first metal layer 41 is patterned to form the first source 13, the first drain 14, the second source 23, and the second drain 24. Then, the first active layer 11 and the second active layer 21 are made. Two ends of the first active layer 11 are respectively connected to the first source 13 and the first drain 14, and two ends of the second active layer 21 are respectively connected to the second source 23 and the second drain 24. Both the first active layer 11 and the second active layer 21 are in contact with the first insulation layer 51, in other words, the first active layer 11 and the second active layer 21 are located at a height of a same film layer. This can help reduce a thickness of a film layer of the function module, and further help reduce an overall thickness of the display assembly.

In an embodiment, the first active layer and the second active layer are made of a same material at a same layer, that is, a pattern of the first active layer and a pattern of the second active layer are formed simultaneously in a same process. This can further simplify the process, and reduce complexity of the process.

Figure 3:
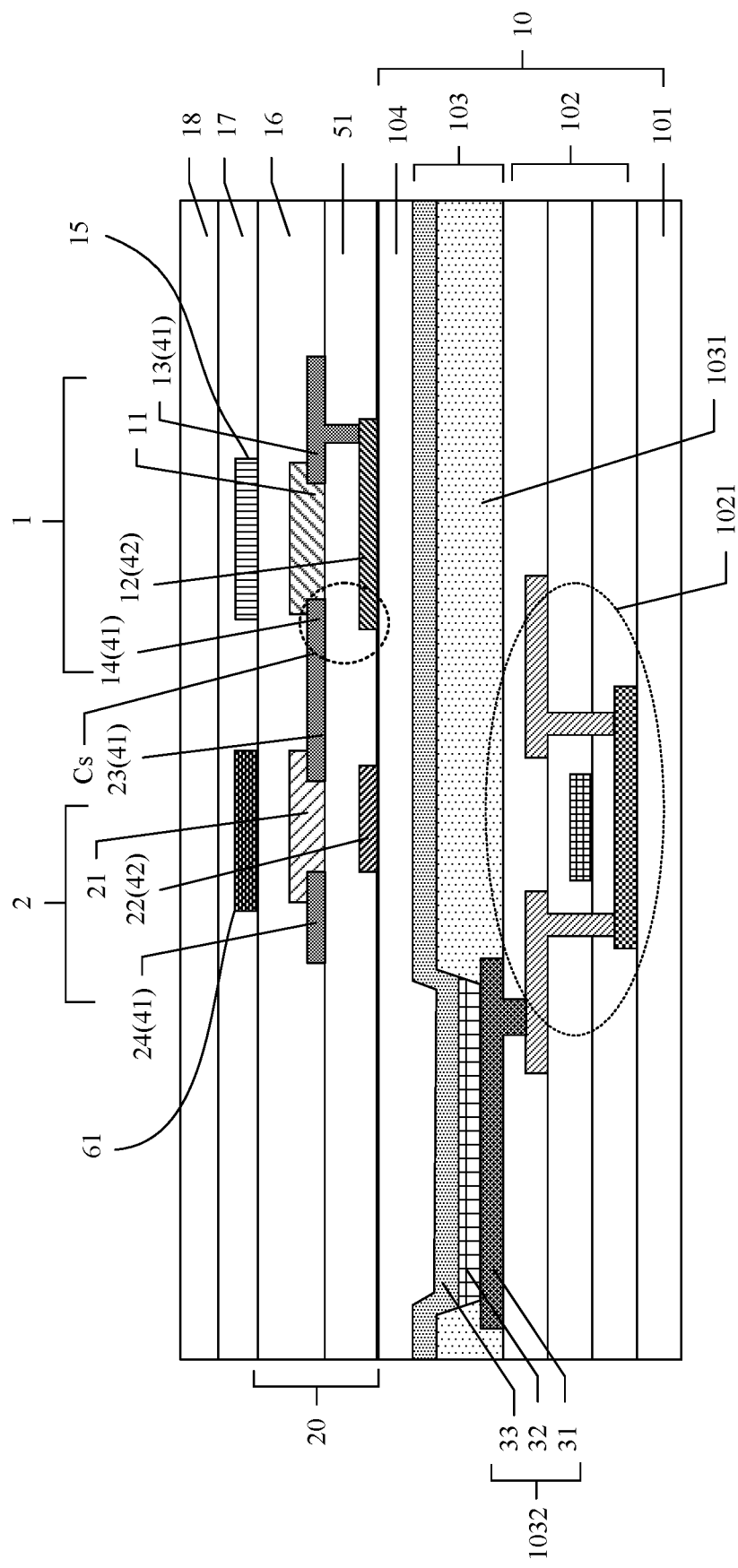
FIG. 3 is another schematic diagram of a partial structure of film layers of a display assembly according to an embodiment of this application.

When the second active layer and the first active layer are made of a same material at a same layer, a light-sensitive band of the second active layer is the same as that of the first active layer. Based on this, to ensure performance reliability of the switch transistor in the fingerprint recognition phase, an embodiment of this application provides another display assembly. FIG. 3 is another schematic diagram of a partial structure of film layers of a display assembly according to an embodiment of this application. The first source 13, the first drain 14, the second source 23, and the second drain 24 are all located at the first metal layer 41. The first gate 12 and the second gate 22 are all located at the second metal layer 42. The first active layer 11 and the second active layer 21 are made of a same material at a same layer, and are in contact with the first insulation layer 51. The function module 20 further includes a plurality of light shielding parts 61 (only one is shown in the figure), one light shielding part 61 corresponds to one switch transistor 2. The light shielding part 61 is located on a side that is of the second active layer 21 and that is away from the display panel 10, and an orthographic projection of the light shielding part 61 on a plane on which the second active layer 21 is located covers the second active layer 21. A material for making the light shielding part 61 may be a metal material, an organic light absorbing material, or the like. In practice, a corresponding material may be selected based on a light-sensitive band of an organic semiconductor material used in the first active layer to make the light shielding part. This ensures that the light shielding part shields light of the band. The light shielding part can shield light, to prevent the light from irradiating to a surface of the second active layer, so that a carrier inside the second active layer increases. This avoids impact on an on/off status of the switch transistor, and ensures accuracy and performance reliability of fingerprint recognition detection.

Specifically, that the light shielding part 61 is in direct contact with the dielectric layer 16 is equivalent to that the light shielding part 61 and the transparent electrode 15 are disposed at a height of a same film layer. This can help reduce a thickness of a film layer of the function module, and further help reduce an overall thickness of the display assembly.

Specifically, in the embodiment shown in FIG. 1, both the first active layer 11 and the second active layer 21 are in contact with the first insulation layer 51, and the second active layer 21 and the first active layer 11 are made of different materials. In this case, a light-sensitive band of the second active layer 21 is different from a light-sensitive band of the first active layer 11. In the fingerprint recognition phase, only the first active layer is sensitive to light emitted by the fingerprint recognition light source. Even though irradiating to a surface of the second active layer, fingerprint reflected light is not absorbed by the second active layer to affect the on/off status of the switch transistor. In this implementation, no light shielding part needs to be disposed at the second active layer to shield light. This can cancel a process of making the light shielding part.

Figure 4:
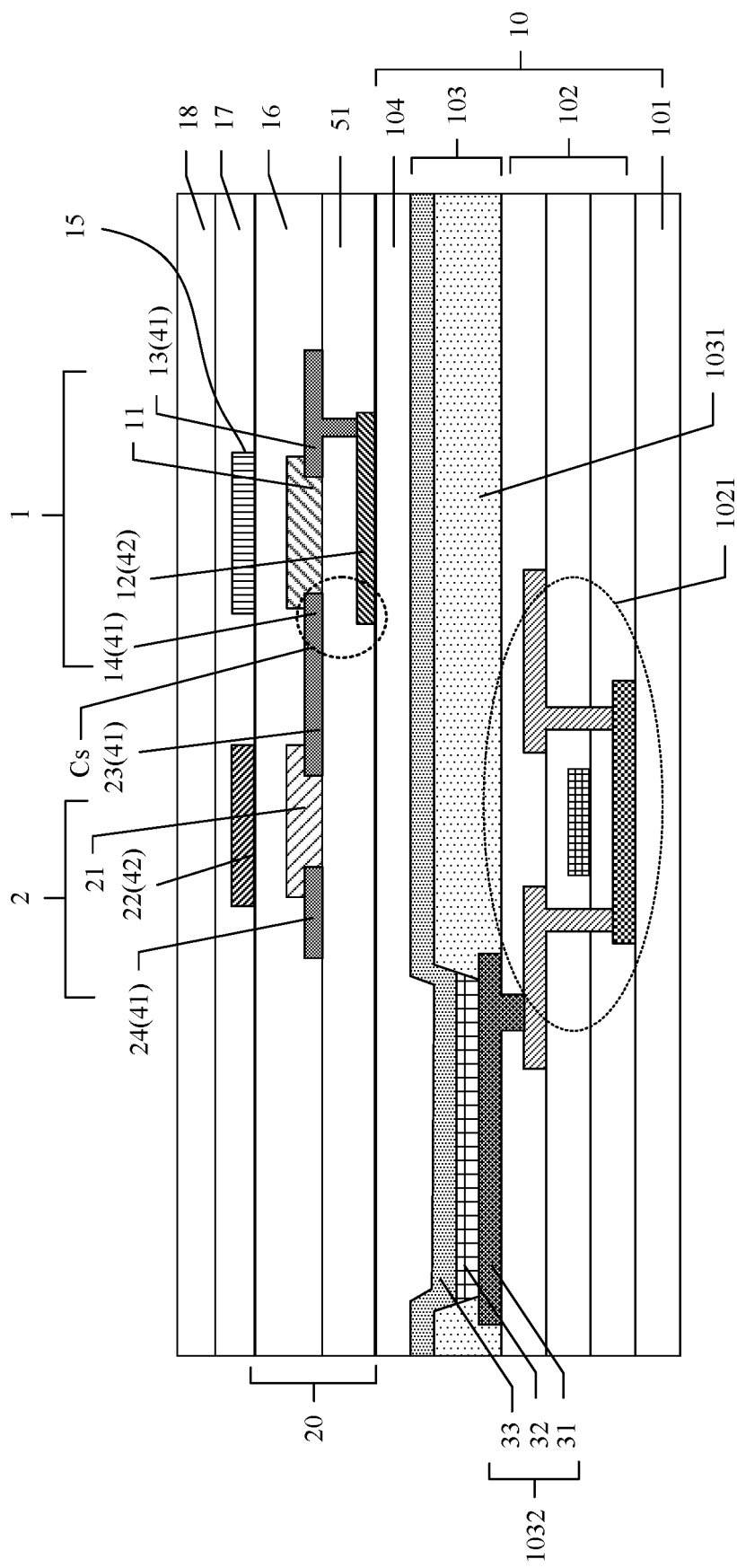
FIG. 4 is another schematic diagram of a partial structure of film layers of a display assembly according to an embodiment of this application.

In another embodiment, the second gate of the switch transistor and the first gate of the phototransistor are located at different metal layers. FIG. 4 is another schematic diagram of a partial structure of film layers of a display assembly according to an embodiment of this application. The first source 13, the first drain 14, the second source 23, and the second drain 24 are all located at the first metal layer 41. The first gate 12 is located at the second metal layer 42. Both the first active layer 11 and the second active layer 21 are located on a side that is of the first insulation layer 51 and that is away from the second metal layer 42, and are in contact with the first insulation layer 51. The second gate 22 is located on a side that is of the second active layer 21 and that is away from the display panel 10, and a dielectric layer 15 is spaced between the second gate 22 and the second active layer 21. In this implementation, the first active layer and the second active layer may be made of a same material at a same layer, so as to ensure that the switch transistor and the phototransistor share a part of the making process. This reduces complexity of the making process. In addition, in a fingerprint recognition phase, the second gate disposed on a side that is of the second active layer and that is away from the display panel can be reused as a light shielding part. The second gate can shield light, to prevent fingerprint reflected light from irradiating to a surface of the second active layer, so that a carrier inside the second active layer increases to affect an on/off status of the switch transistor. This ensures accuracy and performance reliability of fingerprint recognition.

Still refer to FIG. 1. The first source 13 is connected to the first gate 12 through a via 511 on the first insulation layer 51. That is, the first gate 12 and the first source 13 of the phototransistor 1 are connected, so that the phototransistor 1 always works in an off status. In this case, when no light irradiates to a surface of the first active layer 11, a leakage current of the phototransistor 1 is very small. However, in the fingerprint recognition phase, when fingerprint reflected light irradiates to the surface of the first active layer 11, a carrier generated inside the first active layer enables the leakage current of the phototransistor 1 to increase obviously, so that it can be ensured that the phototransistor has high optical sensitivity.

Figure 5:
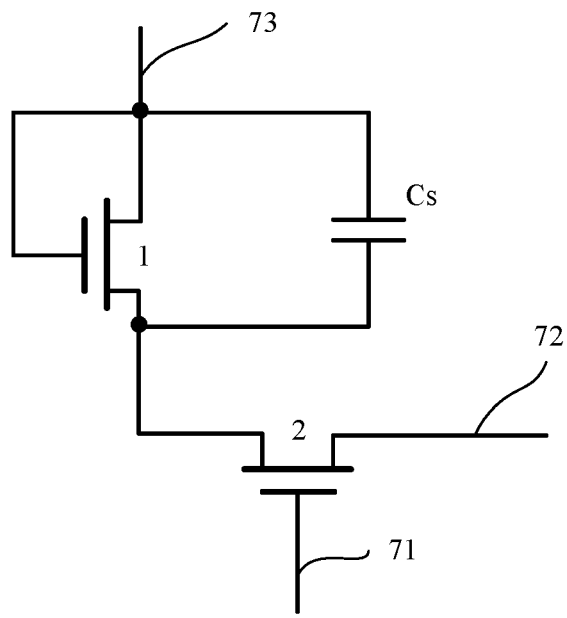
FIG. 5 is a schematic diagram of a circuit structure of a function unit in a display assembly according to an embodiment of this application.
Figure 6:
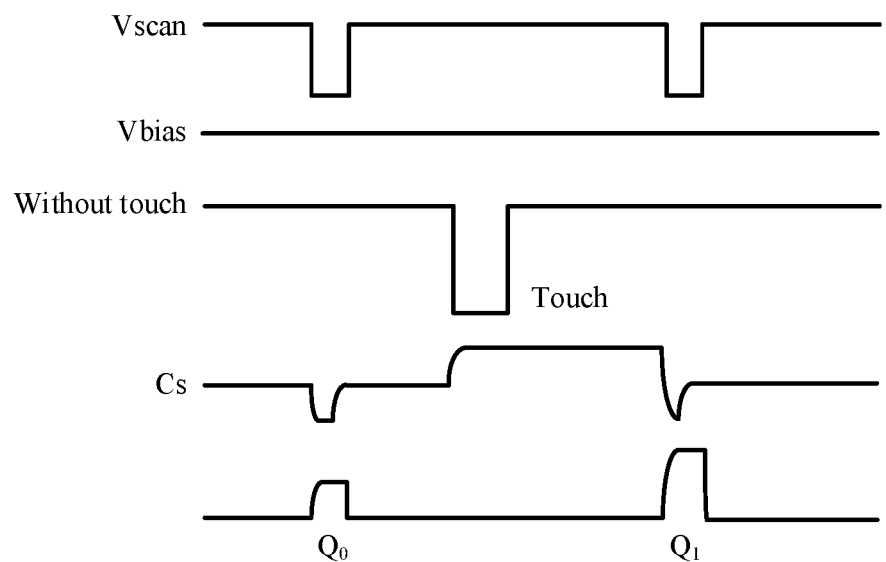
FIG. 6 is a sequence diagram of a circuit of the function unit in the embodiment in FIG. 5 in a touch control phase.
Figure 7:
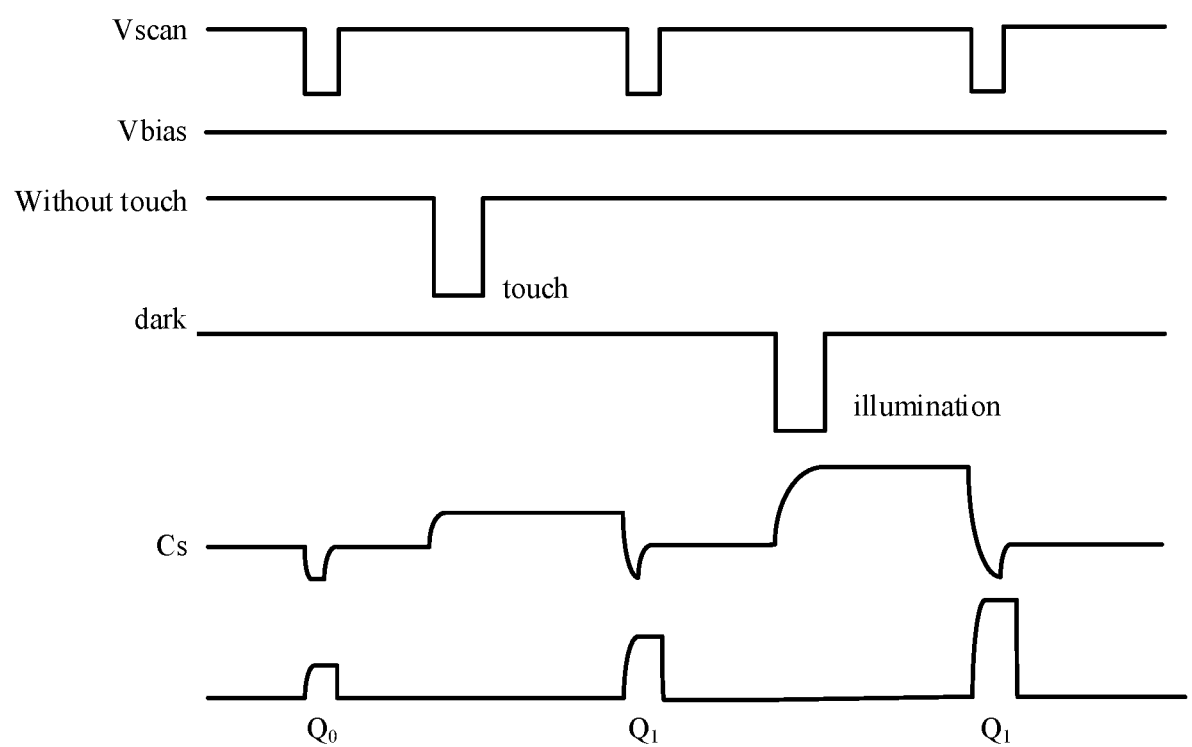
FIG. 7 is a sequence diagram of a circuit of the function unit in the embodiment in FIG. 5 in a fingerprint recognition phase.

FIG. 5 is a schematic diagram of a circuit structure of a function unit in a display assembly according to an embodiment of this application. FIG. 6 is a sequence diagram of a circuit of the function unit in the embodiment in FIG. 5 in a touch control phase. FIG. 7 is a sequence diagram of a circuit of the function unit in the embodiment in FIG. 5 in a fingerprint recognition phase.

As shown in FIG. 5, the function module includes a control signal line 71, a data signal line 72, and a third voltage signal line 73. A second gate of the switch transistor 2 is electrically connected to the control signal line 71, a second drain of the switch transistor 2 is electrically connected to the data signal line 72, and both the first gate 12 and the first source 13 are electrically connected to the third voltage signal line 73. It should be noted that the switch transistor and the phototransistor in this embodiment of this application may be p-type transistors, or may be n-type transistors, provided that it is ensured that the switch transistor and the phototransistor are of a same type.

In a touch control detection process: In a startup phase, the control signal line 71 provides a control signal Vscan to the switch transistor 2, in this phase, the control signal line 71 provides a non-valid level signal to control the switch transistor 2 to be turned off, the data signal line 72 feeds a read potential into the second drain of the switch transistor 2, the first source and the first gate of the phototransistor 1 are connected, and the third voltage signal line 73 feeds a bias voltage Vbias. In this case, the phototransistor 1 is in an off status, that is, in a dark (dark) state, and under an action of a leakage current of the phototransistor 1, the first capacitor Cs starts charging to accumulate a small amount of charge, which is recorded as an amount of initial charge $Q_0$. In an initial signal reading stage, the control signal line 71 provides a valid level signal to the switch transistor 2 to control the switch transistor 2 to be turned on. In this case, the first capacitor Cs discharges, the data signal line 72 reads the amount of initial charge $Q_0$ through the second drain 24, and then the control signal line 71 provides a non-valid level signal to control the switch transistor 2 to be turned off. There is no touch of a finger in the startup phase and the initial signal reading phase, that is, without touch in the sequence diagram. In a touch signal accumulation phase, the finger touches (touches) a display assembly, and in response to the touch of the finger, an electric field between the transparent electrode 15 and the first active layer 11 changes, so that the amount of charge accumulated during charging of the first capacitor Cs increases, and is recorded as an amount of touch charge $Q_1$. In a touch signal reading phase, the control signal line 71 provides a valid level signal to control the switch transistor 2 to be turned on. In this case, the first capacitor Cs discharges, the amount of touch charge $Q_1$ is read through the second drain 24, and a touch position of the finger is determined based on the amount of touch charge $Q_1$. After the touch operation of the finger is identified, the touch position of the finger is determined based on a coordinate position of the function unit disposed in a system mainboard. Then, the system mainboard controls, based on the touch position, the display assembly to perform a corresponding operation, thereby implementing a touch control function.

In a fingerprint recognition process: In a startup phase, the control signal line 71 provides a control signal Vscan to the switch transistor 2, in this phase, the control signal line 71 provides a non-valid signal to control the switch transistor 2 to be turned off, the data signal line 72 feeds a read potential to the second drain of the switch transistor 2, the first source and the first gate of the phototransistor 1 are connected, and the third voltage signal line 73 feeds a bias voltage Vbias. In this case, the phototransistor 1 is in an off status, that is, in a dark (dark) state, and under an action of a leakage current of the phototransistor 1, the first capacitor Cs starts charging to accumulate a small amount of charge, which is recorded as an amount of initial charge $Q_0$. In an initial signal reading stage, the control signal line 71 provides a valid level signal to the switch transistor 2 to control the switch transistor 2 to be turned on. In this case, the first capacitor Cs discharges, the data signal line 72 reads the amount of initial charge $Q_0$ through the second drain 24, and then the control signal line 71 provides a non-valid level signal to control the switch transistor 2 to be turned off. There is no touch (no touch) of a finger in the startup phase and the initial signal reading phase. In a touch signal accumulation phase, the finger touches (touches) a display assembly, and in response to the touch of the finger, an electric field between the transparent electrode 15 and the first active layer 11 changes, so that the amount of charge accumulated during charging of the first capacitor Cs increases, and is recorded as an amount of touch charge $Q_1$. In a touch signal reading phase, the control signal line 71 provides a valid level signal to control the switch transistor 2 to be turned on. In this case, the first capacitor Cs discharges, the amount of touch charge $Q_1$ is read through the second drain 24, and a touch position of the finger is determined based on the amount of touch charge $Q_1$. In a fingerprint recognition light source invoking phase, a fingerprint recognition light source corresponding to the touch position is determined based on the touch position, and the fingerprint recognition light source is controlled to be turned on, so that light emitted from the light source penetrates through the transparent electrode 15 and then is emitted to the first active layer 11 of the phototransistor 1 after being reflected by the finger. In a fingerprint signal accumulation phase, after the phototransistor 1 receives the light reflected by the finger, the phototransistor 1 changes from the dark state to an illumination (illumination) state, so that the current in the phototransistor 1 increases. In this case, the amount of charge accumulated during charging of the first capacitor Cs increases, and is recorded as an amount of fingerprint charge $Q_2$. In a fingerprint signal reading phase, the fingerprint control signal line 71 provides a valid level signal to control the switch transistor 2 to be turned on. In this case, the first capacitor Cs discharges, and the fingerprint data signal line 72 reads the amount of fingerprint charge $Q_2$ through the second drain 24. The amount of initial charge $Q_0$ and the amount of fingerprint charge $Q_2$ are transferred to a fingerprint data processing module (a module in the system mainboard). The fingerprint data processing module collects fingerprint detection signals returned by a plurality of fingerprint recognition units and performs operation processing, to finally generate fingerprint information and implement a fingerprint recognition function.

Figure 8:
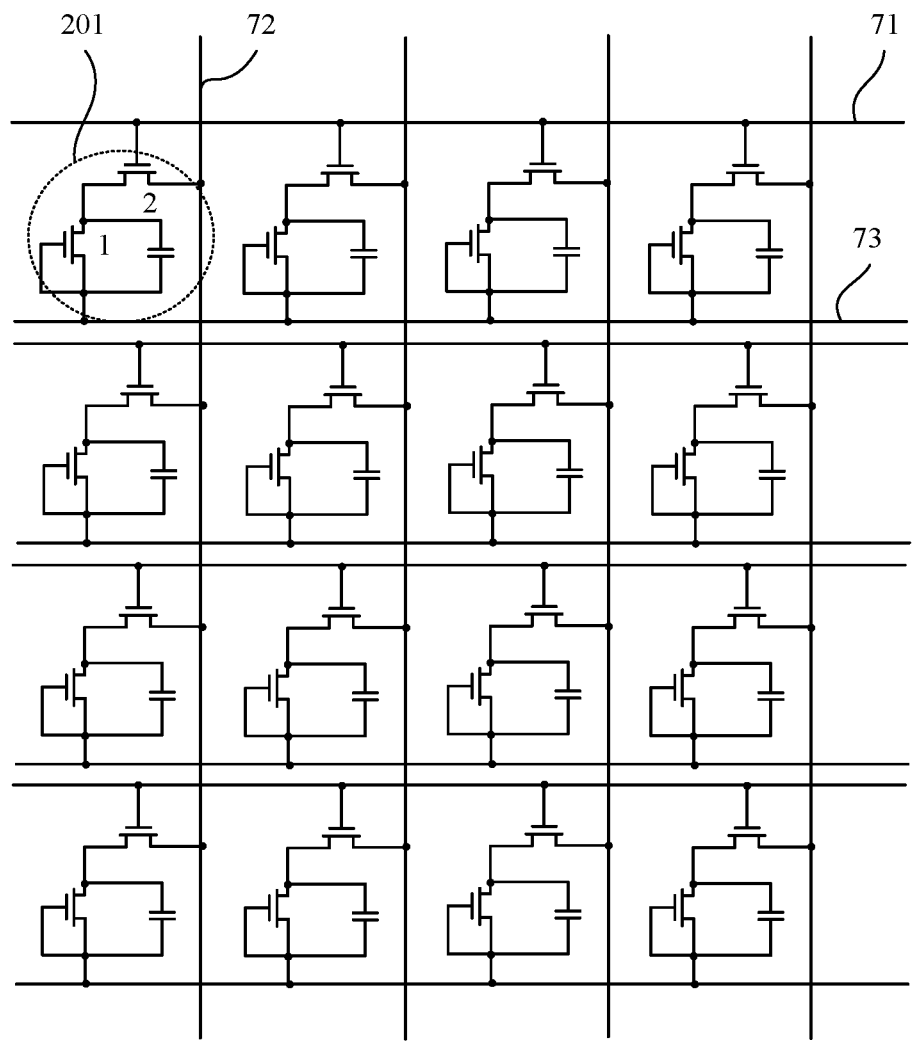
FIG. 8 is a schematic diagram of a circuit structure of a function module in a display assembly according to an embodiment of this application.

Specifically, a plurality of function units in the function module are arranged in an array. As shown in FIG. 8, FIG. 8 is a schematic diagram of a circuit structure of a function module in a display assembly according to an embodiment of this application. A plurality of function units 201 are arranged in an array. Each function unit 201 includes at least one phototransistor 1 and one switch transistor 2. Second gates of the plurality of switch transistors 2 in a same row are electrically connected to one control signal line 71, second drains of the plurality of switch transistors 2 in a same column are electrically connected to one data signal line 72, and first gates 12 and first sources 13 of the plurality of phototransistors 1 in a same row are electrically connected to one third voltage signal line 73.

In a related-technology solution in which a switch transistor and a photodiode are used to integrate touch control and fingerprint recognition, to implement a touch control or fingerprint recognition function, a voltage signal needs to be separately fed into a gate, a source, and a drain of the switch transistor, and one electrode of the photodiode, so that a drive circuit is complex. However, in this embodiment of this application, to implement the touch control or fingerprint recognition function, only a voltage signal needs to be fed into the second gate and the second drain of the switch transistor and the first gate (or the first source) of the phototransistor, so that the drive circuit is simple. Only three types of signal lines need to be disposed in the function module: the control signal line, the data signal line, and the third voltage signal line. This can also simplify a wiring manner in the function module, and reduce space occupied by wiring. In addition, a circuit of the function module is independent of a circuit that drives the display panel to display, and touch control detection or fingerprint recognition detection does not need to be multiplexed with scanning of one frame of picture in a time division manner. This reduces complexity of a circuit structure.

Specifically, the data signal line 72 and the second drain are located at a same metal layer, that is, the data signal line 72 is located at the first metal layer (refer to a film layer position shown in FIG. 1). In this case, the data signal line 72 and the second drain may be made in a same process, and the data signal line 72 and the second drain do not need to be connected through a via of an insulation layer. This simplifies the process. The control signal line 71 and the second gate are located at a same metal layer, the control signal line 71 and the second gate are made in a same making process, and the control signal line 71 and the second gate do not need to be connected through a via of an insulation layer. This simplifies the making process. In addition, the third voltage signal line 73 may be located at a same metal layer as the first gate, or may be located at a same metal layer as the first source.

In an embodiment, the data signal line and the second drain are located at the first metal layer. The third voltage signal line and the first gate are located at the second metal layer. The control signal line and the second gate are located at a same metal layer and located on a side that is of the second active layer and that is away from the display panel. The fingerprint data signal line, the fingerprint control signal line, and the third voltage signal line are separately wired at three different metal layers. This can reduce wiring density at each metal layer.

Figure 9:
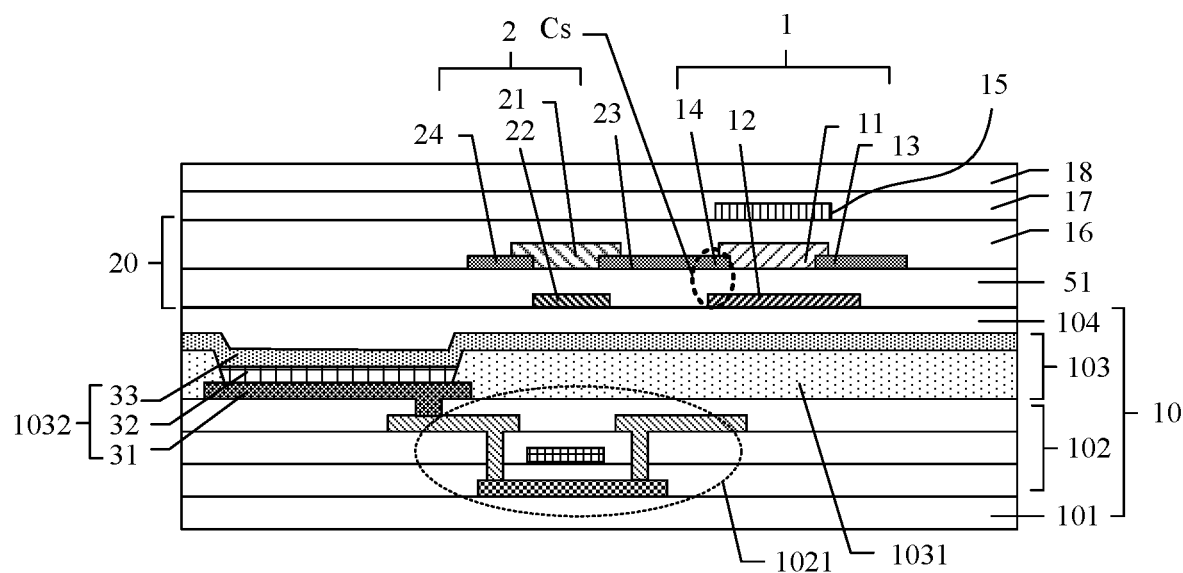
FIG. 9 is another schematic diagram of a partial structure of film layers of a display assembly according to an embodiment of this application.
Figure 10:
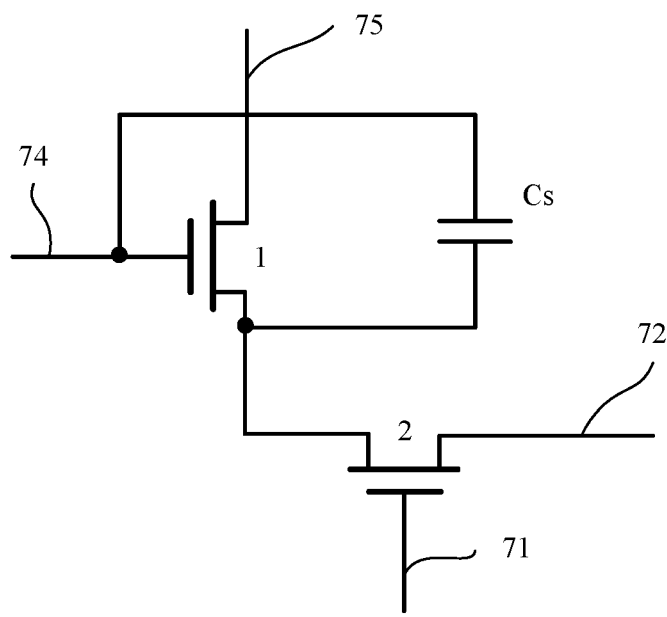
FIG. 10 is a schematic diagram of a circuit structure of a function unit according to the embodiment in FIG. 9.

In another embodiment, the first source and the first gate are not connected, and in the fingerprint recognition phase or the touch control phase, the phototransistor is controlled to work in the off status by separately controlling a value of a voltage supplied to the first source and a value of a voltage supplied to the first gate. FIG. 9 is another schematic diagram of a partial structure of film layers of a display assembly according to an embodiment of this application. FIG. 10 is a schematic diagram of a circuit structure of a function unit according to the embodiment in FIG. 9;

As shown in FIG. 9, that the display panel 10 is an organic light emitting display panel is still used as an example, and the function module 20 is located on the light-emitting surface of the display panel 10. The function module 20 includes a plurality of function units. Each function unit includes at least one phototransistor 1 and one switch transistor 2. The phototransistor 1 includes a first active layer 11, a first gate 12, a first source 13, and a first drain 14. A material for making the first active layer 11 includes an organic semiconductor material. The first drain 14 and the first gate 12 partially overlap to form a first capacitor Cs. The switch transistor 2 includes a second active layer 21, a second gate 22, a second source 23, and a second drain 24. The first drain 14 is connected to the second source 23.

Different from the embodiment in FIG. 1, in the embodiment in FIG. 9, the first source 13 and the first gate 12 are not connected.

As shown in FIG. 10, the function module includes a control signal line 71, a data signal line 72, a first voltage signal line 74, and a second voltage signal line 75. The second gate is electrically connected to the control signal line 71, the second drain is electrically connected to the data signal line 72, the first gate is electrically connected to the first voltage signal line 74, and the first source is electrically connected to the second voltage signal line 75. In a fingerprint recognition phase or a touch control detection phase, a value of a voltage supplied by the first voltage signal line 74 to the first gate is controlled to be greater than a value of a voltage supplied by the second voltage signal line 75 to the first source, to control the phototransistor 1 to be in an off status.

A working process of the function unit in the touch control phase and the fingerprint recognition phase in this implementation may be understood with reference to the foregoing embodiments in FIG. 5, FIG. 6, and FIG. 7, and details are not described herein again.

Figure 11:
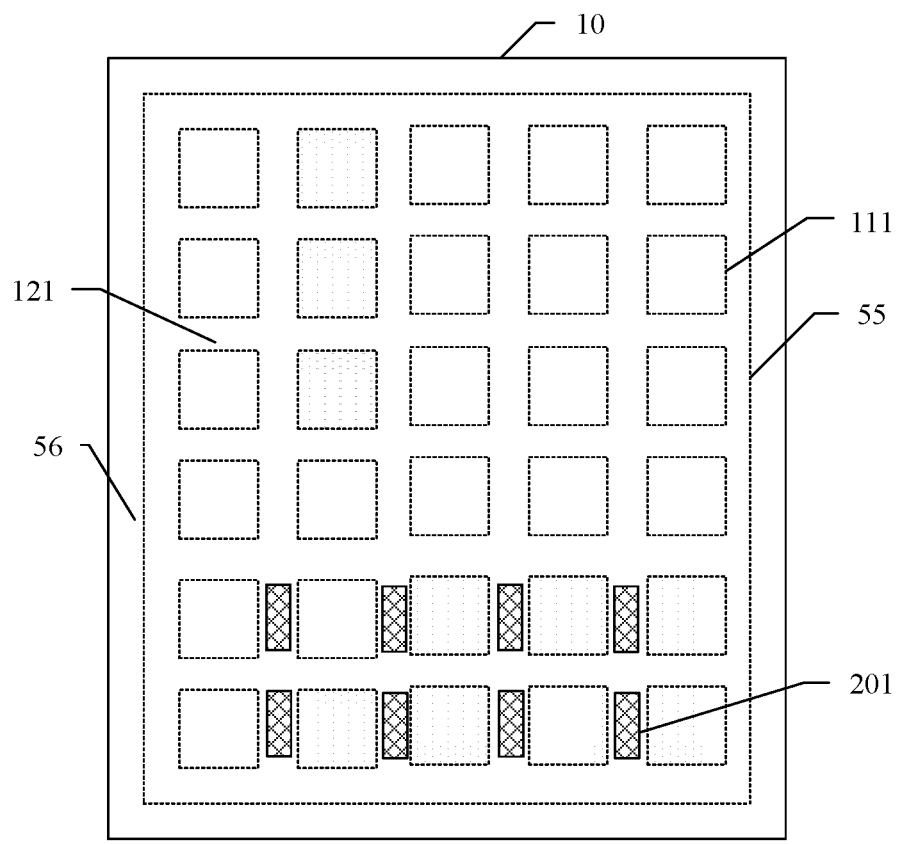
FIG. 11 is a schematic top view of a partial display assembly according to an embodiment of this application.

Further, FIG. 11 is a schematic top view of a partial display assembly according to an embodiment of this application. As shown in FIG. 11, the display panel 10 includes a display area 55 and a non-display area 56, and the display area 55 includes a plurality of pixel areas 111 and a non-pixel area 121 located between adjacent pixel areas 111. The pixel area 111 is a pixel light emitting area, and the non-pixel area 121 is a non-light emitting area. An organic light emitting display panel is used as an example. The pixel area 111 is an area in which a light emitting component is located, and the non-pixel area 121 is an area in which a pixel definition layer spaced from a light emitting component is located. A liquid crystal display panel is used as an example. The liquid crystal display panel includes a black matrix, and the black matrix includes a plurality of openings. An area exposed by the opening is the pixel area 111, and an area between adjacent openings is the non-pixel area. An orthographic projection of the function unit 201 on the display panel 10 is located in the non-pixel area 121. An orthographic projection direction of the function unit 201 towards the display panel 10 is the same as a top-view direction. Therefore, in the top-view direction, the function unit 201 coincides with an orthographic projection of the function unit 201 on the display panel 10. In the top view, the function unit 201 represents an orthographic projection of the function unit 201 on the display panel 10. FIG. 11 shows that the function unit 201 is disposed in only some fixed areas. Optionally, a function unit may be disposed on an entire surface of a corresponding display area, so that touch control and fingerprint recognition functions on the entire surface can be implemented. In this implementation, the function unit corresponds to a non-pixel area of the display panel. When the display assembly displays, the function unit does not shield light emission of the pixel area, so as to ensure that disposition of the function module does not affect a display effect.

Figure 12:
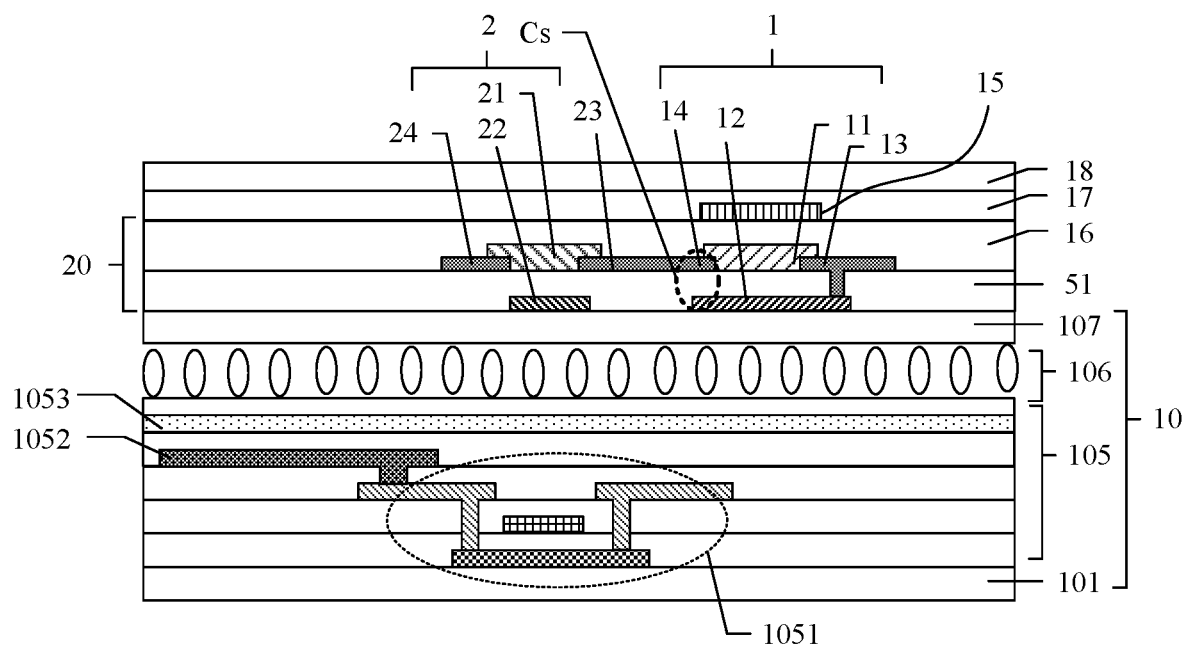
FIG. 12 is another schematic diagram of a partial structure of film layers of a display assembly according to an embodiment of this application.

In all the foregoing embodiments, an example in which the display panel is an organic light emitting display panel is used for description. In the display assembly provided in this embodiment of this application, the display panel may also be a liquid crystal display panel. For details, refer to FIG. 12. FIG. 12 is another schematic diagram of a partial structure of film layers of a display assembly according to an embodiment of this application. The display panel 10 includes a substrate 101, an array substrate 105, a liquid crystal molecule layer 106, and a color filter substrate 107 that are stacked in sequence. The array substrate 105 includes a plurality of pixel circuits. In the figure, only a drive transistor 1051 in the pixel circuit is used as an example. The array substrate further includes a pixel electrode 1052 and a common electrode 1053. The drive transistor 1051 is connected to the pixel electrode 1052. Relative positions of the pixel electrode 1052 and the common electrode 1053 in the figure may be interchanged. The color filter substrate 107 includes a chromatography layer and a black matrix. The function module 20 is located on the display panel. The function module 20 includes a function unit, and the function unit includes at least one phototransistor 1 and one switch transistor 2. For a structure of the phototransistor 1 and a structure of the switch transistor 2 in the function module, refer to the description in any one of the foregoing embodiments. Details are not described herein again.

Figure 13:
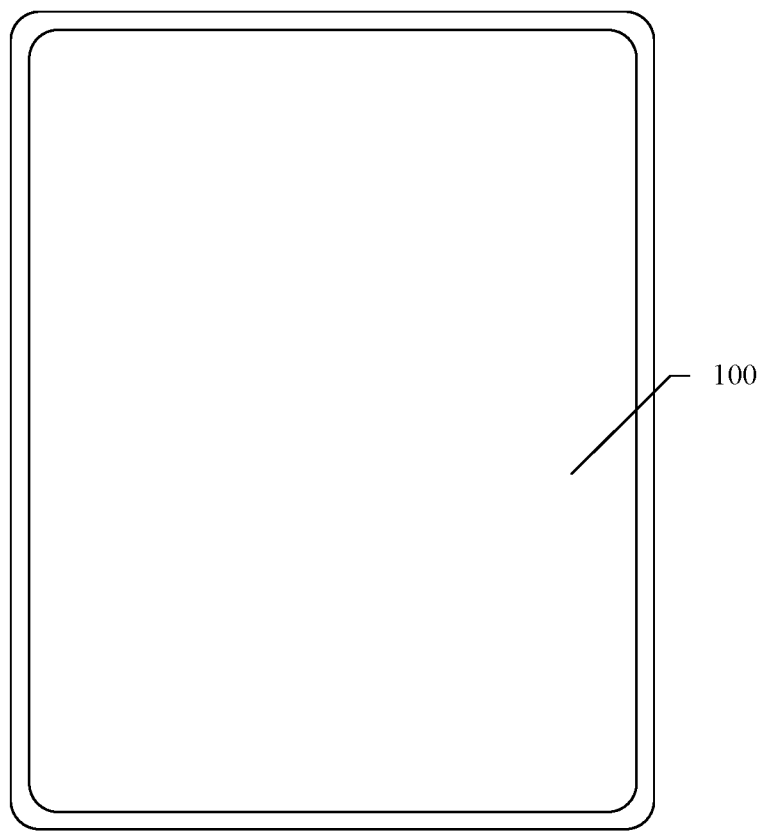
FIG. 13 is a schematic diagram of a display apparatus according to an embodiment of this application.

Based on a same inventive concept, an embodiment of this application further provides a display apparatus. FIG. 13 is a schematic diagram of a display apparatus according to an embodiment of this application. As shown in FIG. 13, the display apparatus includes the display assembly 100 provided in any embodiment of this application. A specific structure of the display assembly 100 has been described in detail in the foregoing embodiment, and details are not described herein again. Certainly, the display apparatus shown in FIG. 13 is merely an example for description. The display apparatus may be any electronic device having touch control and fingerprint recognition functions, such as a mobile phone, a tablet computer, a notebook computer, an e-book, or a television. The display apparatus may be a rigid display apparatus, or may be a flexible or foldable display apparatus. In an embodiment, a pixel unit on a display panel is reused as a light source for fingerprint recognition in a fingerprint recognition phase. In another embodiment, the display apparatus includes a fingerprint recognition light source. The fingerprint recognition light source is located on a side that is of the display panel and that is away from a function module. The fingerprint recognition light source may be an infrared light source, or may be a visible light source.

The foregoing descriptions are merely specific implementations of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A display assembly, comprising a display panel and a function module located on a light-emitting surface of the display panel, wherein:
the function module comprises a plurality of function units, and each function unit comprises at least one phototransistor and one switch transistor;
the phototransistor comprises a first active layer, a first gate, a first source, and a first drain, a material for making the first active layer comprises an organic semiconductor material, the first active layer is located on a side of the first gate away from the display panel, and the first drain and the first gate partially overlap in a direction perpendicular to the display assembly to form a first capacitor;

the switch transistor comprises a second active layer, a second gate, a second source, and a second drain, and the second source is connected to the first drain; and each function unit comprises a transparent electrode, the transparent electrode is located on a side of the first active layer away from the first gate, the transparent electrode overlaps the first active layer in the direction perpendicular to the display assembly, and a dielectric layer is disposed between the transparent electrode and the first active layer.

2. The display assembly according to claim 1, wherein a thickness of the dielectric layer is d1, and 500 nm≤d1≤1000 nm.

3. The display assembly according to claim 1, wherein:
the display assembly further comprises a planarization layer and a protective cover, the planarization layer is located on a side of the function module away from the display panel, and the protective cover is located on a side of the planarization layer away from the function module; and a sum of a thickness of the planarization layer on the top of the transparent electrode and a thickness of the protective cover is d2, and 300 nm≤d2≤1.5 μm.

4. The display assembly according to claim 1, wherein a material for making the dielectric layer comprises any one or more of silicon oxide, aluminum oxide, hafnium oxide, silicon nitride, poly(vinyl cinnamate), polyvinyl alcohol, and polymethyl methacrylate.

5. The display assembly according to claim 1, wherein the function module comprises a first metal layer, and the first source, the first drain, the second source, and the second drain are all located at the first metal layer.

6. The display assembly according to claim 5, wherein:
the function module further comprises a second metal layer and a first insulation layer, the second metal layer is located on a side of the first metal layer close to the display panel, and the first insulation layer is located between the first metal layer and the second metal layer; and the first gate is located at the second metal layer.

7. The display assembly according to claim 6, wherein both the first active layer and the second active layer are located on a side of the first insulation layer away from the second metal layer, and are in contact with the first insulation layer.

8. The display assembly according to claim 6, wherein the first source is connected to the first gate through a via in the first insulation layer.

9. The display assembly according to claim 6, wherein the second gate is located at the second metal layer.

10. The display assembly according to claim 9, wherein the second active layer and the first active layer are made of a same material at a same layer.

11. The display assembly according to claim 10, wherein the function unit further comprises a light shielding part, the light shielding part is located on a side of the second active layer away from the display panel, and an orthographic projection of the light shielding part on a plane on which the second active layer is located covers the second active layer.

12. The display assembly according to claim 1, wherein the second gate is located on a side of the second active layer away from the display panel, and the dielectric layer is spaced between the second gate and the second active layer.

13. The display assembly according to claim 1, wherein:
the display panel comprises a plurality of pixel areas and a non-pixel area located between the adjacent pixel areas; and an orthographic projection of the function unit on the display panel is located in the non-pixel area.

14. The display assembly according to claim 2, wherein the function module comprises a first metal layer, and the first source, the first drain, the second source, and the second drain are all located at the first metal layer.

15. The display assembly according to claim 3, wherein the function module comprises a first metal layer, and the first source, the first drain, the second source, and the second drain are all located at the first metal layer.

16. The display assembly according to claim 4, wherein the function module comprises a first metal layer, and the first source, the first drain, the second source, and the second drain are all located at the first metal layer.

17. The display assembly according to claim 2, wherein the second gate is located on a side of the second active layer away from the display panel, and the dielectric layer is spaced between the second gate and the second active layer.

18. A display apparatus, comprising a display assembly, wherein the display assembly comprises a display panel and a function module located on a light-emitting surface of the display panel, and wherein:
the function module comprises a plurality of function units, and each function unit comprises at least one phototransistor and one switch transistor;

the phototransistor comprises a first active layer, a first gate, a first source, and a first drain, a material for making the first active layer comprises an organic semiconductor material, the first active layer is located on a side of the first gate away from the display panel, and the first drain and the first gate partially overlap in a direction perpendicular to the display assembly to form a first capacitor;

the switch transistor comprises a second active layer, a second gate, a second source, and a second drain, and the second source is connected to the first drain; and each function unit comprises a transparent electrode, the transparent electrode is located on a side of the first active layer away from the first gate, the transparent electrode overlaps the first active layer in the direction perpendicular to the display assembly, and a dielectric layer is disposed between the transparent electrode and the first active layer.

19. A driving method for a display assembly, wherein the display assembly comprises a display panel and a function module located on a light-emitting surface of the display panel, and wherein:
the function module comprises a plurality of function units, and each function unit comprises at least one phototransistor and one switch transistor;

the phototransistor comprises a first active layer, a first gate, a first source, and a first drain, a material for making the first active layer comprises an organic semiconductor material, the first active layer is located on a side of the first gate away from the display panel, and the first drain and the first gate partially overlap in a direction perpendicular to the display assembly to form a first capacitor;

the switch transistor comprises a second active layer, a second gate, a second source, and a second drain, and the second source is connected to the first drain; and each function unit comprises a transparent electrode, the transparent electrode is located on a side of the first active layer away from the first gate, the transparent electrode overlaps the first active layer in the direction perpendicular to the display assembly, and a dielectric layer is disposed between the transparent electrode and the first active layer; and wherein the driving method comprises:
- controlling both the switch transistor and the phototransistor to be turned off, and charging the first capacitor to accumulate an amount of initial charge under an action of a leakage current of the phototransistor;
- controlling the switch transistor to be turned on, discharging the first capacitor, and controlling the switch transistor to be turned off after reading the amount of initial charge through the second drain;
- in response to a touch of a finger, changing an electric field between the transparent electrode and the first active layer, and charging the first capacitor to accumulate an amount of touch charge; and
- controlling the switch transistor to be turned on, discharging the first capacitor, reading the amount of touch charge through the second drain, and determining a touch position of the finger based on the amount of touch charge.

20. The driving method according to claim 19, wherein the driving method further comprises:
- determining, based on the touch position, a fingerprint recognition light source corresponding to the touch position, and controlling the fingerprint recognition light source to be turned on;
- after the phototransistor receives light reflected by the finger, increasing the leakage current, and charging the first capacitor to accumulate an amount of fingerprint charge; and
- controlling the switch transistor to be turned on, discharging the first capacitor, and reading the amount of fingerprint charge through the second drain.

* * * * *